United States Patent [19]

Horne et al.

[11] Patent Number: 4,911,231

[45] Date of Patent: Mar. 27, 1990

[54] ELECTRONIC ENCLOSURE COOLING SYSTEM

[75] Inventors: David Horne, Winchester; Clive J. Penfold, Havant, both of England

[73] Assignee: BICC Public Limited Company, London, England

[21] Appl. No.: 257,530

[22] Filed: Oct. 14, 1988

[30] Foreign Application Priority Data

Oct. 15, 1987 [GB] United Kingdom ............... 8724263

[51] Int. Cl.⁴ ..................... H01L 23/46; F28F 13/12
[52] U.S. Cl. ......................... 165/104.34; 165/104.33; 165/122; 361/384
[58] Field of Search ..................... 165/104.34, 104.33, 165/122; 361/383, 384

[56] References Cited

U.S. PATENT DOCUMENTS 4,386,651  6/1983  Reinhard ..................... 165/104.33
4,644,443  2/1987  Swensen et al. .................. 361/384

FOREIGN PATENT DOCUMENTS 2622470  12/1977  Fed. Rep. of Germany .................. 165/104.33
2744664  4/1979  Fed. Rep. of Germany .................. 165/104.33

OTHER PUBLICATIONS

Rittal Catalogue, Rittal Ltd., of Summit House, Sheffield, England, p. 174, (1986).

*Primary Examiner*—Albert W. Davis, Jr.
*Attorney, Agent, or Firm*—Oliff & Berridge

[57] ABSTRACT

A cooling system for use in an enclosure housing heat-emitting electrical and/or electronic apparatus comprises, in combination, a fan unit and, separately formed with respect to the fan unit, a cooling unit 12. The fan unit includes electrically driven fans mounted with their axes vertical and the cooling unit includes open ended tubes arranged side by side with their axes in a horizontal plane and transversely spaced apart to form passages therebetween. One open end of each tube is adjacent the front of the rack and is open to the atmosphere through a grill; the other open end of each tube is spaced inwardly from the rear of the rack and opens into an otherwise fluid-tight compartment in which are housed electrically driven fans and associated deflectors. Air within the enclosure heated by heat emitted by the electrical and/or electronic apparatus is caused to flow upwardly or downwardly by the fans of the fan unit through the passages between the transversely spaced tubes of the cooling unit and is cooled by air initially at ambient temperature which is drawn by the fans of the cooling unit from outside the enclosure through tubes of the cooling unit into the compartment and is deflected by the deflectors through other tubes of the cooling unit and out of the unit.

5 Claims, 2 Drawing Sheets

ELECTRONIC ENCLOSURE COOLING SYSTEM

This invention relates to cabinets, cases and other enclosures housing heat-emitting electrical and/or electronic apparatus and is particularly concerned with enclosures of this kind in which electrical and/or electronic apparatus is mounted on racks, trays or other supports detachably housed in the enclosure.

The invention is especially, but not exclusively, concerned with enclosures of this kind in which circuit boards are accommodated in racks which are detachably housed in the enclosure and which generally comprise pairs of opposed guide rails into which edges of a circuit board can be slid from the front of the rack and edge connectors at the rear of the rack which co-operate with connectors mounted on the rear edges of circuit boards that have been slid into opposed guide rails of the rack.

It is an object of the present invention to provide, for use in an enclosure housing heat-emitting electrical and/or electronic apparatus, an improved cooling system which is efficient in operation and which can be readily adjusted to vary the cooling effect to meet a particular requirement.

According to the invention, the improved cooling system comprises, in combination, at least one fan unit comprising a tray or other support for detachably housing in the enclosure and at least one electrically driven fan mounted on the tray or other support with its axis of rotation substantially vertical and, separately formed with respect to the fan unit, at least one cooling unit comprising a rack or other support for detachably housing in the enclosure, a plurality of substantially straight open-ended tubes arranged side by side on the rack or other support with their axes lying in a common substantially horizontal plane and transversely spaced apart to form passages therebetween, one open end of each tube being positioned at or near one side face of the rack or other support and the other open end of each tube being spaced inwardly from the oppositely disposed side face of the rack or other support and opening into an otherwise substantially fluid-tight compartment on the rack or other support and, housed in said compartment, at least one electrically driven fan and at least one deflector associated with said fan or fans, the arrangement being such that, when the fan unit and cooling unit are detachably housed in an enclosure, air within the enclosure heated by heat-emitting electrical and/or electronic apparatus housed therein is caused to flow upwardly or downwardly by the fan or fans of the fan unit through the passages between the transversely spaced horizontally disposed tubes of the cooling unit and is cooled by air initially at ambient temperature which is drawn from outside the enclosure by the fan or fans of the cooling unit through tubes of the cooling unit into said compartment and is deflected by the deflector or deflectors through other tubes of the cooling unit out of the cooling unit.

Preferably, to provide for high efficiency of heat transfer between the heated air flowing upwardly or downwardly through the passages between the tubes of the or each cooling unit and air initially at ambient temperature flowing through said tubes, each tube of the or each cooling unit has a transverse cross-section of approximately elongate shape, at least a major part of the longer side walls of each tube lying substantially vertical when the cooling unit is detachably housed in an enclosure In a preferred embodiment, each longer side wall of each tube has a height of 20 n and a length of approximately 50 n, where n is the width of the tube.

To improve transfer of heat from air in the enclosure passing upwardly or downwardly through the passages between the tubes of the cooling unit to air flowing into and out of the tubes of the cooling unit, preferably the walls of the tubes bounding the passages are ribbed or are otherwise shaped to create turbulence in the air in the enclosure passing through the passages and in the air flowing into and out of the tubes. For example, neighbouring walls of adjacent tubes may each have a pattern of outwardly protruding rectilinear ribs, the ribs of on wall extending transversely of the ribs of the other wall and each pattern of ribs being inclined at an acute angle to the axes of the tubes.

The or each fan of the or each cooling unit preferably has an associated filter positioned in the compartment of the unit between the fan and the open ends of the tubes through which air is drawn into the compartment. The compartment of the or each cooling unit may be wholly separately formed with respect to and detachably mounted on the rack or other support or the compartment may be formed in part by the rack or other support.

The or each cooling unit preferably comprises two electrically driven fans transversely spaced across the width of the compartment of the unit, each of which fans is mounted with its axis of rotation lying in a substantially horizontal plane and inclined at an acute angle to the axes of the tubes of the unit. In a preferred embodiment, the axis of each fan is inclined to the axes of the tubes at an angle lying in the range 2° to 22°. Preferably, each of the fans of the or each cooling unit has an associated deflector and, preferably also, the two fans of the cooling unit are so positioned that air initially at ambient temperature is drawn through two groups of tubes of the cooling unit, one group constituting approximately a quarter of the tubes of the unit and lying near one side face of the rack or other support and the other group constituting approximately a quarter of the tubes of the unit and lying ear the oppositely disposed side face of the rack or other support, and the two deflectors are so positioned and/or shaped that they will deflect said air into a central group of tubes constituting approximately half of the tubes of the unit and lying between the two groups of tubes through which air initially at ambient temperature is drawn into the compartment, from which central group of tubes the air is expelled to the atmosphere. The face of the rack or other support remote from the compartment preferably carries a grill through which air can flow into and out of the tubes of the cooling unit.

The invention also includes, for use in the improved cooling system, a cooling unit substantially as hereinbefore described.

The fan unit of the improved cooling system preferably has at least two electrically driven fans mounted on the tray or other support of the unit at transversely spaced positions with their axes lying substantially vertical.

By virtue of the fact that the tan and cooling units are separately formed with respect to one another and are used in combination to form the cooling system of an enclosure, each of the fan unit/s and the cooling unit/s can be detachably housed in any position in an enclosure. That is to say, the or a fan unit can be in an upper part or a lower part of an enclosure and the or a cooling unit can be either below or above the or a fan unit. Additionally, the or each cooling unit can be detachably housed in an enclosure so that it is immediately adjacent any selected electrical or electronic apparatus within the enclosure or it can be spaced any distance therefrom, thereby providing a facility for ready adjustment of the cooling effect to suit any particular requirement.

The invention further includes an enclosure housing heat-emitting electrical and/or electronic apparatus, wherein an improved cooling system as hereinbefore described is detachably mounted in the enclosure.

The invention is further illustrated by description, by way of example, of a preferred cooling system for use in an enclosure housing heat-emitting electrical and/or electronic apparatus, and of a preferred cooling unit of the cooling system, with reference to the accompanying drawings, in which.

Figure 1:
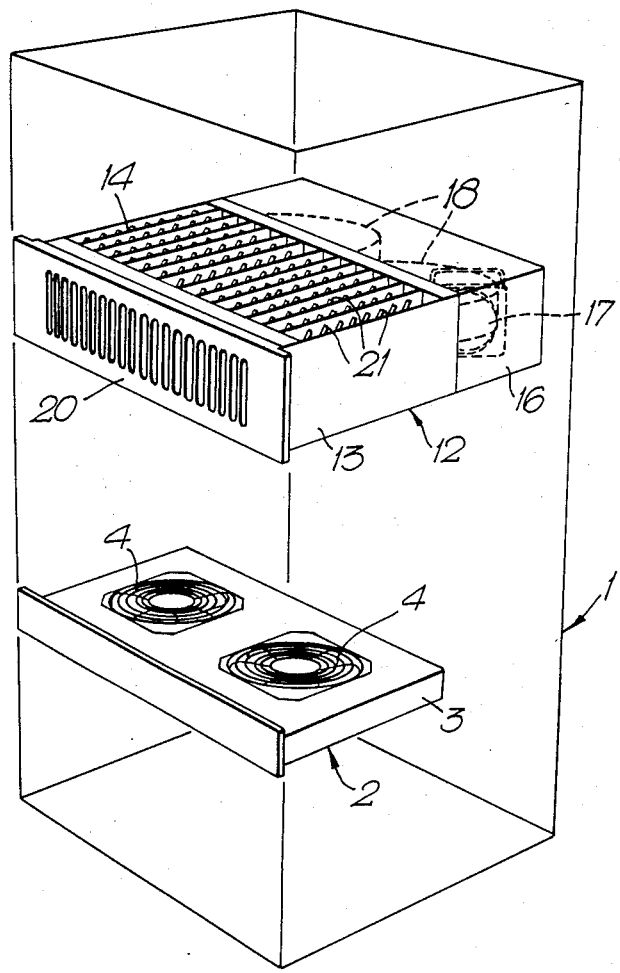
FIG. 1 is a fragmental isometric view of the enclosure with the preferred cooling system detachably housed therein.

Referring to FIG. 1, an enclosure 1 housing heat-emitting electrical and/or electronic apparatus (not shown) mounted on racks detachably housed in the enclosure also houses the preferred cooling system comprising, in combination, a fan unit 2 detachably housed in a lower part of the enclosure and the preferred cooling unit 12 detachably housed in an upper part of the enclosure.

The fan unit 2 comprises a tray 3 which is detachably housed in the enclosure 1 and two electrically driven fans 4 each mounted on the tray with its axis of rotation vertical.

Figure 2:
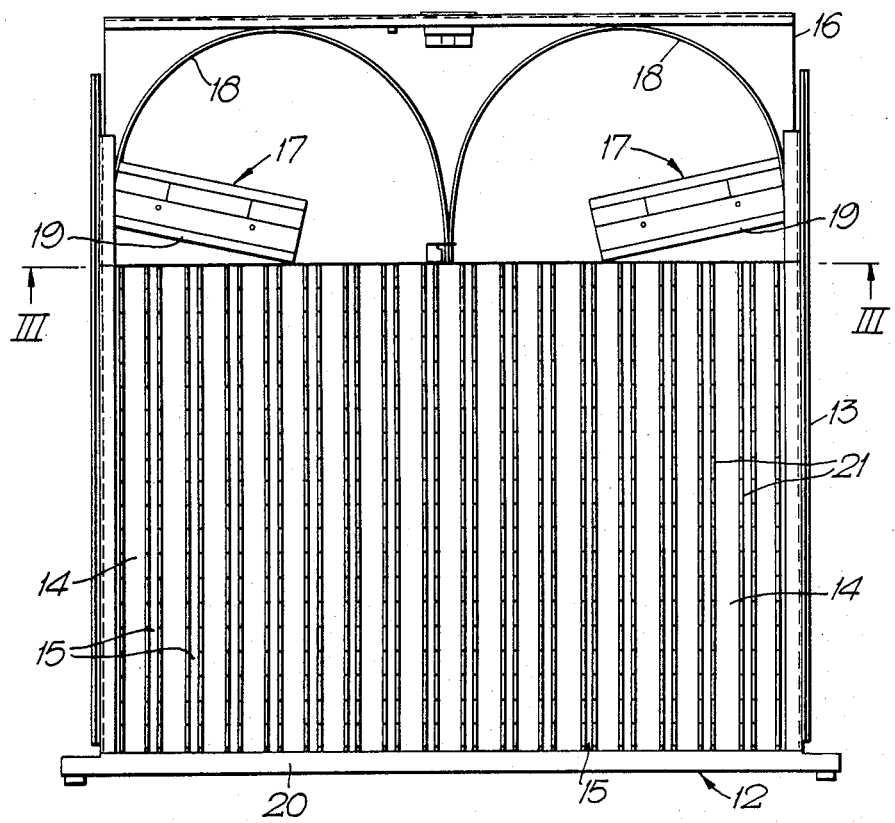
FIG. 2 is a plan view of the preferred cooling unit.
Figure 3:
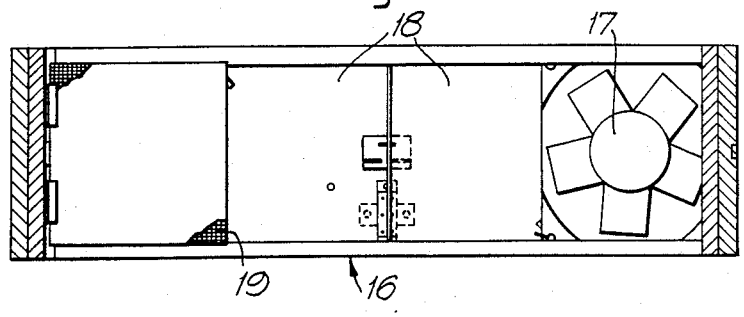
FIG. 3 is a fragmented cross-section view of the preferred cooling unit taken on the line III—III in FIG. 2 with the filter associated with one of the fans omitted.

As is more clearly seen in FIGS. 2 and 3, the preferred cooling unit 12 comprises a rack 13 which is detachably housed in the enclosure 1 and a plurality of straight open-ended metal tubes 14 arranged side by side on the rack with their axes lying in a common horizontal plane and transversely spaced apart to form passages 15 therebetween. One open end of each tube 14 is positioned near the front side face of the rack 13 and the other open end of the tube is spaced inwardly from the oppositely disposed rear side face of the rack and opens into an otherwise fluid-tight compartment 16 mounted on the rack. Each metal tube 14 has a transverse cross-section of approximately elongate shape, a major part of the longer side walls of each tube lying vertical. Neighbouring walls of adjacent metal tubes 14 each have a pattern of outwardly protruding rectilinear ribs 21, the ribs of one wall extending transversely of the ribs of the other wall and each pattern of ribs being inclined at an acute angle to the axes of the tubes. Housed in compartment 16 are two electrically driven fans 17 and, associated with each fan, a deflector 18 of approximately semi-circular shape. Each fan 16 is mounted with its axis of rotation lying in a horizontal plane and inclined at an angle of approximately 10° to the axes of the tubes 14. A filter 19 is secured to the housing of each fan 17 between the fan and the adjacent open ends of the tubes 14. The other open ends of the tubes 14 are adjacent the front side face of the rack 13 where there is a grill 20.

Figure 4:
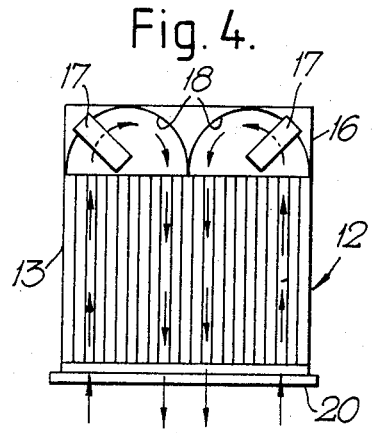
FIG. 4 is a diagrammatic plan view of the preferred cooling unit illustrating the paths of air passing into and out of the unit.

Air within the enclosure 1 heated by heat-emitting electrical and/or electronic apparatus (not shown) housed in the enclosure is caused to flow upwardly by the fans 3 of the fan unit 1 through the passages 15 between the transversely spaced horizontally disposed open-ended metal tubes 14 of the cooling unit 12. Air initially at ambient temperature is drawn by the fans 17 of the cooling unit 12 from outside the enclosure 1 through two groups of tubes 14 of the cooling unit into the compartment 16, one group of tubes constituting approximately a quarter of the tubes of the unit and lying near one side face of the rack and the other group constituting approximately a quarter of the tubes of the unit and lying near the oppositely disposed side face of the rack. As will be seen on referring to FIG. 4, the two deflectors 18 of the cooling unit 12 are so positioned and shaped that they deflect air drawn into the compartment 16 through said tubes by the fans 17 from the compartment into a central group of tubes constituting approximately half of the tubes of the unit, from which central group of tubes the air is expelled to the atmosphere. During the cooling process, the air drawn into the metal tubes 14 extracts heat from the air in the enclosure passing upwardly through the passages 15 through the walls of the metal tubes, the ribs 21 on the walls of the tubes creating turbulence in the air passing through the tubes and in the air in the enclosure passing upwardly through the passages and so improving transfer of heat from the air in the enclosure passing upwardly through the passages to the air passing into and out of the cooling unit.

The cooling system of the present invention is especially but not exclusively designed for cooling enclosures which are to be used in contaminated atmospheres because the tubes for flow of air into and out of the cooling unit are entirely separate from the air within the enclosure so that air within the enclosure cannot be contaminated by the air drawn into the cooling unit.

What we claim as our invention is:

1. A cooling system for use in an enclosure housing heating-emitting apparatus, which cooling system comprises, in combination, at least one fan unit comprising a support for detachably housing in the enclosure and at least one electrically driven fan mounted on the support with its axis of rotation substantially vertical and, separately formed with respect to the fan unit, at least one cooling unit comprising a support for detachably housing in the enclosure, a plurality of substantially straight open-ended tubes arranged side by side on the support with their axes lying in a common substantially horizontal plane and transversely spaced apart to form passages therebetween, one open en of each tube being positioned near one side face of the support and the other open end of each tube being spaced inwardly from the oppositely disposed side face of the support and opening into an otherwise substantially fluid-tight compartment on the support and, housed in said compartment, at least one electrically driven fan and at least one deflector associated with said fan or fans, the arrangement being such that, when the fan unit and cooling unit are detachably housed in an enclosure, air within the enclosure heated by heat-emitting apparatus housed therein is caused to flow by the fan or fans of the fan unit through the passages between the transversely spaced horizontally disposed tubes of the cooling unit and is cooled b air initially at ambient temperature which is drawn from outside the enclosure by the fan or fans of the cooling unit through tubes of the cooling unit into said compartment and is deflected by the deflector or deflectors through other tubes of the cooling unit out of the cooling unit.

2. A cooling system as claimed in claim 1, wherein the cooling unit comprises two electrically driven fans transversely spaced across the width of the compartment of the unit, each of which fans is mounted with its axis of rotation lying in a substantially horizontal plan and inclined at an acute angle to the axes of the tubs of the unit.

3. A cooling system as claimed in claim 2, wherein the two fans of the cooling unit are so positioned that air initially at ambient temperature is drawn through two groups of tubes of the cooling unit, one group constituting approximately a quarter of the tubes of the unit and lying near one side face of the support and the other group constituting approximately a quarter of the tubes of the unit and lying near the oppositely disposed side face of the support, and two deflectors, one associated with each fan, are so positioned and shaped that they will deflect said air into a central group of tubes constituting approximately half of the tubes of the unit and lying between the two groups of tubes through which air initially at ambient temperature is drawn into the compartment, from which central group of tubes the air is expelled to the atmosphere.

4. A cooling system as claimed in claim 1, wherein the fan unit has at least two electrically driven fans mounted on the support of the unit at transversely spaced positions with their axes lying substantially vertical.

5. An enclosure housing heat-emitting apparatus, wherein the enclosure also houses a cooling system as claimed in claim 1.

* * * * *